United States Patent
Carkner

(10) Patent No.: US 8,427,171 B2
(45) Date of Patent: Apr. 23, 2013

(54) BATTERY CONNECTION FAILURE DETECTION SYSTEM

(76) Inventor: Steve Carkner, Ottawa (CA)

(*) Notice: Subject to any disclaimer, the term of this patent is extended or adjusted under 35 U.S.C. 154(b) by 310 days.

(21) Appl. No.: 12/795,533

(22) Filed: Jun. 7, 2010

(65) Prior Publication Data
US 2011/0298472 A1    Dec. 8, 2011

(51) Int. Cl.
*G01R 31/04* (2006.01)
*G01R 31/00* (2006.01)

(52) U.S. Cl.
USPC ................. 324/538; 324/756.05

(58) Field of Classification Search .............. 324/537, 324/500, 538, 756.05
See application file for complete search history.

(56) References Cited

U.S. PATENT DOCUMENTS

| | | | | |
|---|---|---|---|---|
| 4,949,046 | A * | 8/1990 | Seyfang | 324/427 |
| 5,767,661 | A * | 6/1998 | Williams | 320/152 |
| 2002/0135379 | A1* | 9/2002 | Moreaux et al. | 324/500 |
| 2004/0106022 | A1* | 6/2004 | Saito et al. | 429/22 |
| 2004/0164744 | A1* | 8/2004 | Koga et al. | 324/537 |
| 2007/0013382 | A1* | 1/2007 | Hinz et al. | 324/500 |
| 2007/0120537 | A1* | 5/2007 | Yamamoto | 320/150 |
| 2008/0136378 | A1* | 6/2008 | Iwahana et al. | 320/153 |

* cited by examiner

*Primary Examiner* — Hoai-an D Nguyen
(74) *Attorney, Agent, or Firm* — Gordon Thomson

(57) ABSTRACT

A system and method of detecting battery connection failures relies upon measuring battery cell body temperature and battery connector temperature at a measured current. The difference between these two temperatures is calculated using a software driven comparator. The comparator compares the difference as measured against a predetermined safe difference for the measured current. If the measured value exceeds the predetermined safe value an alarm is given. In one embodiment of the invention the difference between the two temperatures is compared to a predetermined safe difference independent of current measurements.

11 Claims, 5 Drawing Sheets

BATTERY CONNECTION FAILURE DETECTION SYSTEM

CROSS-REFERENCE TO RELATED APPLICATIONS

Not Applicable.

STATEMENT REGARDING FEDERAL FUNDING

Not applicable.

BACKGROUND

1. Field of the Invention

This invention relates to battery systems and specifically to a battery connection failure detection system.

2. Description of the Problem

Battery packs are generally made from a number of individual cells that are connected in series to provide higher voltages and/or parallel to provide higher current. A number of inventions address the fundamental issue of how to connect such cells including bolting, soldering, friction and welding methods.

A disadvantage of the existing connection methods is that they may all, at some point, be prone to failure. This can be caused by corrosion, physical impact, vibration or components coming loose. If bolts securing the cells become lose resistance increases and so does connection temperature. This could cause a fire. This is particularly troublesome in hybrid vehicles using high capacity and high voltage electrical storage systems for electrical motors.

Battery safety systems employ thermal sensors placed near the battery cells which are used to detect thermal runaway events where cells have experienced a catastrophic failure. This failure can occur during charging or discharging. It is hoped that electrically disconnecting the battery would halt further heating and prevent fire from occurring. Such sensors often operate based on a single temperature threshold, for example 80 degrees centigrade, as a point where battery operation is considered unsafe.

Battery safety systems occasionally include thermal sensors located on the electronic components that are used to carry the battery power. These components are often rated to withstand up to 175 degrees centigrade. Therefore, the temperature threshold used to determine mis-operation of such devices is usually set in excess of 100 degrees centigrade.

There remains a need for a battery safety system that can determine the health of the battery connections and can therefore take preventative action when such connections are found to be unhealthy. There further exists a need for such detection methods to be predictive of such failure before it reaches catastrophic levels.

SUMMARY

In a preferred embodiment of the invention the system is composed of a current sensor capable of monitoring current flow into and out of the battery and multiple temperature sensors arranged to sense various positions of the battery pack including at a minimum one sensor on the cell body and one sensor near the cell connections. During normal operation the temperature of the cell connections would be similar to the temperature of the body of each cell.

Large battery packs with many cells would include more temperature sensors to ensure that an individual cell failure or an individual connection failure could be detected.

Under high load, when a connection is failing, the resistance of the connection will rise. This increase in resistance will cause the temperature near the cell connection to rise beyond the levels normally expected for that given load. Comparing the cell temperature, the current flow, and the temperature near the cell connections will allow a simple software algorithm to determine if the cell connection temperature is higher than expected and therefore if the connection is degraded. This ensures that any degradation in the cell connection will be detected before the resistance climbs to the point where the heat generated is sufficient to cause a fire.

In an alternative embodiment of the invention, the system is composed of multiple temperature sensors arrange to sense various positions of the battery pack including at a minimum one sensor for the ambient environment and one sensor near the cell connections. In this way, large temperature differences between the cell temperature and the connection temperature will indicate localized production of heat near the cell connection and therefore a degradation of that connection. This can be done without knowing the actual current flow of the battery.

A third embodiment of the invention would include at least two temperature sensors located near the cell connections. In this embodiment, which is especially useful on larger batteries, the temperature of several different cell connections can be monitored and compared against each other. Since the current flowing through the battery is expected to be equal through cells connected in series, any individual cell connection exhibiting higher than expected temperatures with respect to other connections would be suspected to be in a degraded connection.

In all of the above embodiments, the primary detection threshold for a degraded cell connection is based on at least a temperature difference between two different temperatures. This improves the system safety as a degraded connection can be detected with temperature differences of only a few degrees centigrade, even in cold environments.

Similar detection methods can be accomplished with a variety of temperature sensing technologies including resistance transducers, thermocouples, infrared and semiconductor junctions. The use of any particular technology, thermal monitoring, current monitoring or power monitoring methods would still employ the fundamental aspect of seeking to qualify cell connection health based on the energy being lost at a degraded connection that has some amount of current flowing through it.

Electrical connections in general can use this method of detecting failure. This method is not limited to batteries and could be applied to other fields including capacitors, generators, switches and terminal blocks.

DETAILED DESCRIPTION

Figure 1:
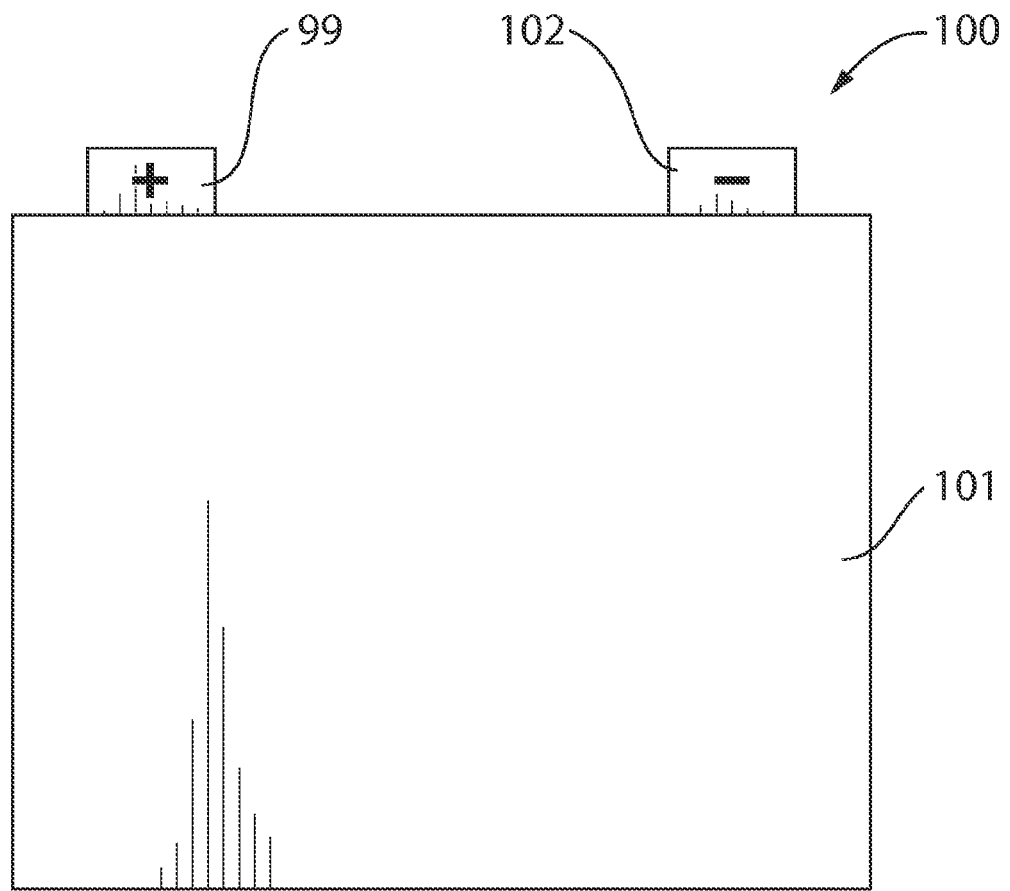
FIG. 1 is a sketch of a typical pouch cell.

Referring to FIG. 1, one example of an individual electrochemical cell (100) is shown. Multiple technologies exist for electrically connecting cells, in this case the cell body (101)

contains the electrochemical mix and collector plates. The electricity is then delivered via thin cell tabs (99 and 102) which must be electrically connected to a load.

Figure 2:
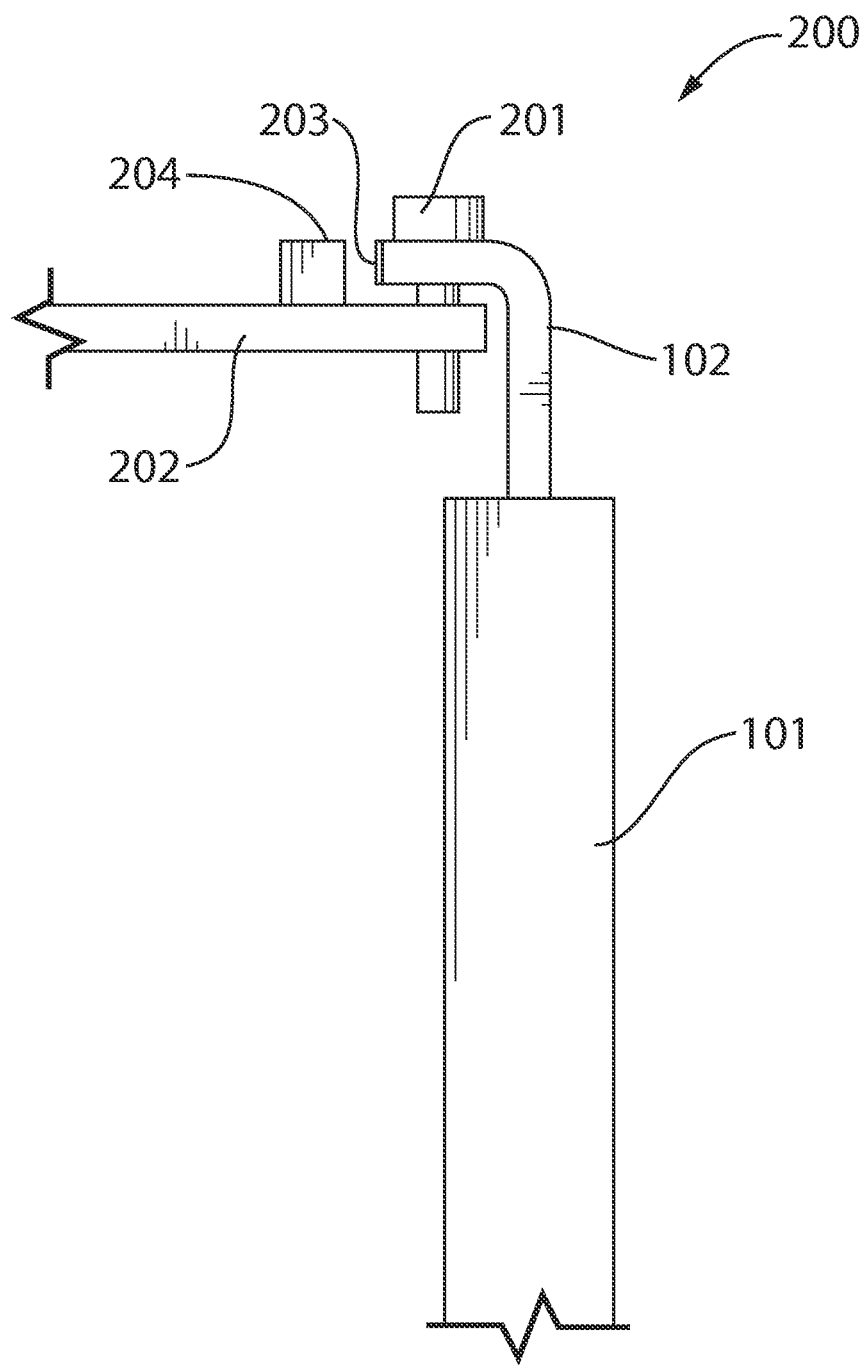
FIG. 2 is a sketch of a typical bolt-on cell connection.

FIG. 2 shows a side view of the cell body (101) with the cell tab (102) bent over a circuit board (202). The circuit board would normally contain conductive elements which are brought into contact with the cell tab via a bolt (201) such that the cell tab and the circuit board form a connection (203). It can be appreciated from viewing this simple drawing that other connection methods including solder, rivets, welding or friction could accomplish the same goal. In addition, the circuit board (202) could be replaced with any conductive element including a solid metal bus bar, wires or sheet metal. The quality of the electrical connection (203) is monitored through temperature sensor (204) in close proximity to the connection.

Figure 3:
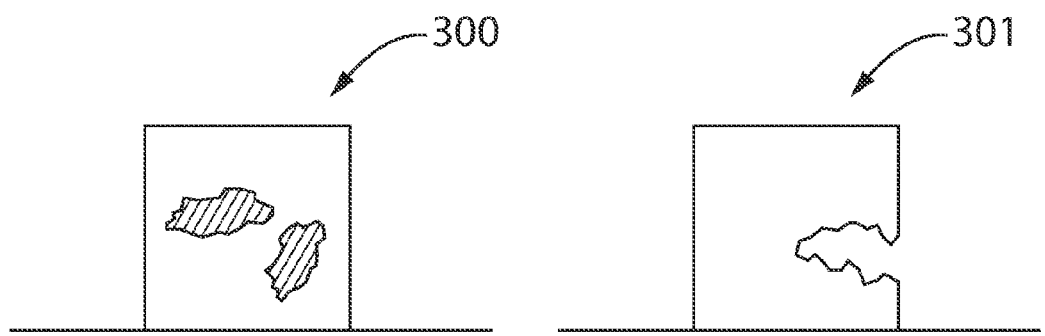
FIG. 3 is a sketch of cell tab failures.

FIG. 3 shows examples of a corroded cell tab (300) and a partially torn cell tab (301). In both cases, bolting the cell tab into a battery assembly would probably work. The battery would be able to deliver significant current and would probably pass all production testing. However, as the corrosion spreads or if the tear in the cell tab gets worse due to vibration, heat will be generated due to the degradation of the cell connection. This could eventually lead to a fire. By monitoring the cell tab temperature, these flaws would be detected in production or if they occur later in a field application. Even a small rise in temperature is sufficient to detect that a connection is starting to degrade.

Figure 4:
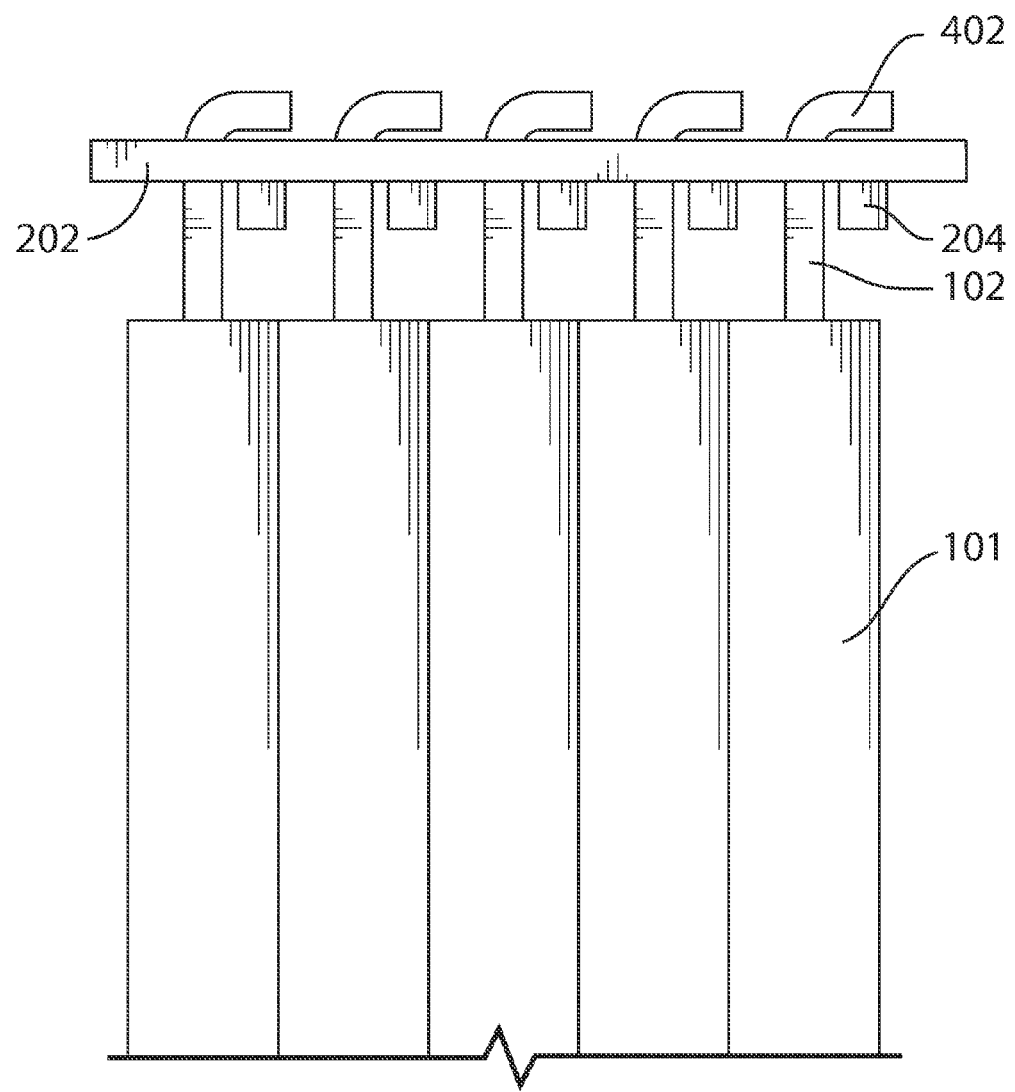
FIG. 4 is a sketch of multiple cell connections.

FIG. 4 shows a side view of multiple cell bodies (101) stacked together. Multiple cell tabs (102) form multiple connections (402) to the circuit board (202). In this case multiple temperature sensors (204) are used to monitor each tab connection. If the temperature of one tab is significantly higher than the others, it will be detected as a degraded connection and possible safety hazard.

Figure 5:
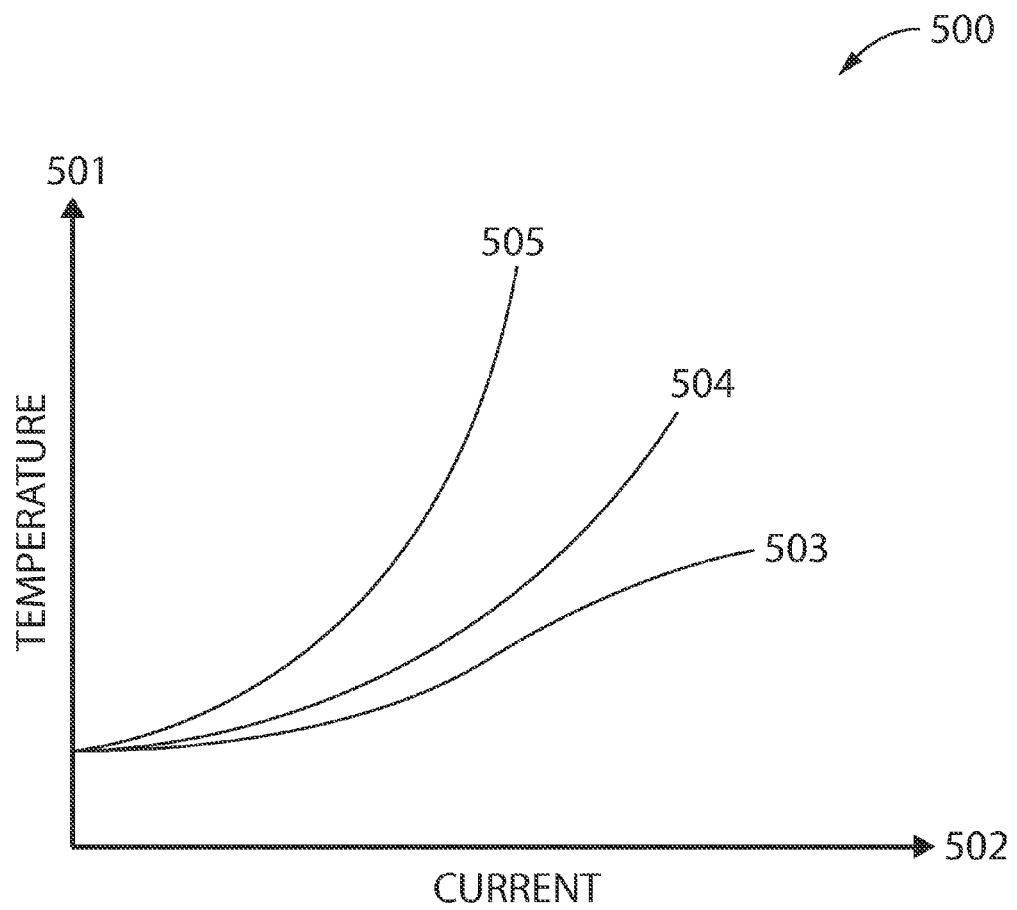
FIG. 5 is a graph of cell tab temperature rise.

FIG. 5 shows a graph (500) with current flow on the horizontal X axis (502) and temperature on the vertical Y axis (501). For example only, line 503 may be considered a normal response for the cell connection rise in temperature as current increases. Line 504 may be considered a degraded connection that shows early signs of failure but is not yet a complete catastrophic failure. Line 505 is a catastrophic failure where continued increase in current will clearly cause the temperature to rise exponentially leading to a fire. These temperatures on the vertical Y axis (501) could be based on the temperature difference between different battery connections, or between one connection and ambient air, or between the cell connection and the cell body.

Although the description above contains much specificity, these should not be construed as limiting the scope of the invention but as merely providing illustrations of the presently preferred embodiment of this invention. Thus the scope of the invention should be determined by the appended claims and their legal equivalents.

What is claimed is:

1. An electrical power system comprising an at least one battery cell comprising a cell body, a positive electrical connector for connection to a power transfer means, a negative electrical connector for connection to said power transfer means and a load drawing power from said cell body through the power transfer means, wherein:
    a) said electrical power system further includes means for detecting degradation of at least one of said positive and said negative electrical connectors;
    b) the power transfer means comprises one of a power regulator mounted to a circuit board having conducting elements, a bus bar, a wire or a sheet of metal; and,
    c) said means for detecting degradation of said at least one of the positive and negative electrical connectors comprises an at least one cell body temperature sensor disposed on the cell body; an at least one electrical connector temperature sensor placed close to the at least one of the positive and negative electrical connectors to measure the temperature of the at least one of the connectors and a software driven comparator in electrical communication with said at least one cell body temperature sensor, said at least one electrical connector temperature sensor and a connector current sensor, wherein said software driven comparator includes means for calculating, at a point in time, a difference between a measured cell body temperature and a measured at least one electrical connector temperature at a measured connector current at said point in time.

2. The electrical power system of claim 1 wherein the software driven comparator further includes means for comparing said difference at said measured connector current against a predetermined safe difference at the measured connector current.

3. The electrical power system of claim 2 wherein the software driven comparator further includes an alarm signal means for actuating an alarm when the difference exceeds said predetermined safe difference at the measured connector current.

4. The electrical power system of claim 2 wherein the means for detecting degradation of at least one of the positive and negative connectors further comprises a software driven comparator in electrical communication with said at least one cell body temperature sensor and said at least one electrical connector temperature sensor, wherein the software driven comparator includes a means for calculating, at a point in time, a difference between a measured cell body temperature and a measured electrical connector temperature.

5. The electrical power system of claim 4 wherein said software driven comparator further comprises an alarm signal means for actuating an alarm when said difference exceeds said predetermined safe difference, and wherein said alarm signal is independent of the electrical connector current.

6. The electrical power system of claim 2 wherein said means for detecting degradation of at least one of the positive and negative connectors further comprises a positive connector temperature sensor, a negative connector temperature sensor, a software driven comparator in electrical communication with said positive connector temperature sensor and said negative connector temperature sensor, wherein said software driven comparator includes a means for calculating a difference between a measured positive connector temperature and a measured negative connector temperature, and wherein the software driven comparator includes means for comparing said difference with a predetermined safe difference; and further wherein the software driven comparator includes an alarm signal means for actuating an alarm when the difference exceeds said predetermined safe difference.

7. A battery connection failure detection system for an electrical power system, said electrical power system comprising an at least one battery cell comprising a cell body, a positive electrical connector for connection to a power transfer means, a negative electrical connector for connection to said power transfer means and a load drawing power from said cell body through the power transfer means, wherein said battery connection failure detection system comprises an at least one cell body temperature sensor disposed on the cell body and an at least one electrical connector temperature sensor placed close to at least one of said positive and said negative electrical connectors to measure the temperature of said at least one of the connectors, a software driven comparator in electrical communication with said at least one cell body temperature sensor and said at least one electrical connector temperature sensor, wherein said software driven comparator further includes: means for calculating a difference in temperature between a measured cell body temperature and a measured electrical connection temperature; means for comparing said difference in measured temperature with a predetermined safe difference in temperature; and, means for signaling an alarm when the difference exceeds said predetermined safe difference.

8. The battery connection failure detection system of claim 7 further comprising an at least one current sensor for measuring current in said at least one of the positive and negative electrical connectors, wherein said at least one current sensor is in electrical communication with the software driven comparator, and wherein the software driven comparator further includes: means for calculating the difference in temperature between the measured cell body temperature and the measured electrical connection temperature at a measured current; means for comparing the difference in measured temperature with a predetermined safe temperature at said measured current; and, means for signaling an alarm when the difference exceeds said predetermined safe difference for the measured current.

9. The battery connection failure detection system of claim 7 comprising a positive connector temperature sensor, a negative connector temperature sensor, a software driven comparator in electrical communication with said positive connector temperature sensor and said negative connector temperature sensor, wherein said software driven comparator includes a means for calculating a difference between a measured positive connector temperature and a measured negative connector temperature, and wherein the software driven comparator includes means for comparing said difference with a predetermined safe difference; and further wherein the software driven comparator includes an alarm signal means for actuating an alarm when the difference exceeds said predetermined safe difference.

10. A method for detection a connection failure in an electrical power system comprising an at least one battery cell comprising a cell body, a positive electrical connector for connection to a power transfer means, a negative electrical connector for connection to said power transfer means and a load drawing power from said cell body through the power transfer means, said method comprising the following steps:
 a) placing at least one cell body temperature sensor on said cell body;
 b) placing at least one electrical connector temperature sensor close to at least one of said positive and said negative electrical connectors;
 c) providing a software driven comparator and placing said at least one cell body temperature and said at least one electrical connector temperature sensor in electrical communication with said software driven comparator;
 d) measuring a cell body temperature at a given point in time;
 e) measuring a connection temperature at said given point in time;
 f) determining a difference between said cell body temperature and said connection temperature at the given point in time;
 g) comparing said difference to a predetermined safe difference; and,
 h) providing an alarm when the difference exceeds said predetermined safe difference.

11. The method of claim 10 further comprising the steps of:
 a) after step (b) place a current sensor on at least one of the electrical connectors;
 b) after step (e) measuring a current at the given point in time;
 c) after step (f) providing a second predetermined safe difference at said measured current; and,
 d) comparing the difference at the measured current to said second predetermined safe difference; and,
 e) following step (h).

* * * * *